United States Patent
Wieczorek et al.

[11] Patent Number: 6,150,243
[45] Date of Patent: Nov. 21, 2000

[54] SHALLOW JUNCTION FORMATION BY OUT-DIFFUSION FROM A DOPED DIELECTRIC LAYER THROUGH A SALICIDE LAYER

[75] Inventors: Karsten Wieczorek, Reichenberg-Boxdorf, Germany; Nick Kepler, Saratoga, Calif.; Larry Wang, San Jose, Calif.; Paul R. Besser, Sunnyvale, Calif.

[73] Assignee: Advanced Micro Devices, Inc., Sunnyvale, Calif.

[21] Appl. No.: 09/186,065

[22] Filed: Nov. 5, 1998

[51] Int. Cl.$^7$ .......................... H01L 21/22; H01L 21/38; H01L 21/8238

[52] U.S. Cl. .......................... 438/558; 438/199; 438/301; 438/655

[58] Field of Search .................... 438/197, 199, 438/301, 542, 558, 563, 783, 655

[56] References Cited

U.S. PATENT DOCUMENTS

| | | | |
|---|---|---|---|
| 4,835,112 | 5/1989 | Pfiester et al. | 435/128 |
| 5,118,639 | 6/1992 | Roth et al. | 438/300 |
| 5,208,472 | 5/1993 | Su et al. | 257/344 |
| 5,536,684 | 7/1996 | Dass et al. | 438/535 |
| 5,569,624 | 10/1996 | Weiner | 438/563 |
| 5,646,435 | 7/1997 | Hsu et al. | 257/382 |
| 5,691,212 | 11/1997 | Tsai et al. | 438/297 |
| 5,691,225 | 11/1997 | Abiko | 438/199 |
| 5,731,239 | 3/1998 | Wong et al. | 438/296 |
| 5,827,760 | 10/1998 | Seo | 438/161 |
| 5,926,715 | 7/1999 | Fan et al. | 438/305 |

OTHER PUBLICATIONS

S.Wolf and R. Tauber, "Silicon Processing for the VLSI Era", vol. 1, Process Technology, pp. 264–267, 323–327, 1986.

Materials and Bulk Processes, "Doping Technologies", The National Technology Roadmap for Semiconductors (1994), pp. 118–121.

"Ultra Shallow Junction Formation Using Diffusion from Silicides" H. Jiang et al., H. Electrochem. Soc., vol. 139, No. 1, Jan. 1992, pp. 196–218.

*Primary Examiner*—Charles Bowers
*Assistant Examiner*—Thanhha Pham

[57] ABSTRACT

Self-aligned, ultra-shallow, heavily-doped source and drain regions of a MOS device are formed by implanting dopant containing ions in a dielectric layer formed on metal silicide layer portions on regions of a silicon-containing substrate where source and drain regions are to be formed in a silicon-containing substrate. Thermal treatment of the implanted dielectric layer results in out-diffusion of dopant through the metal silicide layer and into the region of the silicon-containing substrate immediately below the metal silicide layer portions, thereby forming heavily doped source and drain regions having an ultra-shallow junction spaced apart from the metal silicide/silicon substrate interface by a substantially uniform distance.

19 Claims, 2 Drawing Sheets

SHALLOW JUNCTION FORMATION BY OUT-DIFFUSION FROM A DOPED DIELECTRIC LAYER THROUGH A SALICIDE LAYER

FIELD OF THE INVENTION

The present invention relates to a method of manufacturing high-density integrated semiconductor devices such as MOS transistors and CMOS devices formed in or on a semiconductor wafer substrate and having low resistance, ultra-shallow junctions forming low junction leakage source and drain regions by utilizing self-aligned, refractory metal silicide ("salicide") processing. The invention has particular utility in manufacturing high-density integration semiconductor devices, including multi-level devices, with design rules of 0.18 micron and below.

BACKGROUND OF THE INVENTION

The escalating requirements for high density and performance associated with ultra-large scale integration semiconductor devices necessitate design rules of 0.18 $\mu$m and below, increased transistor and circuit speeds, high reliability, and increased manufacturing throughput. The reduction of design features, e.g., of source, drain, and gate regions of transistors formed in or on a common semiconductor substrate, challenges the limitations of conventional junction and contact formation technology, including photolithographic, etching, and deposition techniques.

As a result of the ever increasing demand for large-scale and ultra-small dimensioned integrated semiconductor devices, self-aligned techniques have become the preferred technology for forming such devices in view of their simplicity and capability of high-density integration. As device dimensions decrease, both vertically and laterally, many problems arise, especially those caused by an increase in sheet resistance of the contact areas to the source and drain regions and junction leakage as junction layer thickness decreases. To overcome this problem, the use of highly electrically conductive refractory metal silicides has become commonplace in the manufacture of integrated semiconductor devices comprising, e.g., MOS type transistors. Another technique employed in conjunction with refractory metal silicide technology is the use of lightly doped drains ("LDDs"). An LDD consists of a lightly doped source/drain region (i.e., dopant density is on the order of about $9\times10^{19}$ da/cm$^3$) formed just at the edge of the gate region, while a more heavily doped drain region (i.e., dopant density is on the order of about $2\times10^{20}$ da/cm$^3$), to which ohmic contact is to be provided, is laterally displaced away from the gate by provision of a sidewall spacer on the gate electrode.

Salicide processing involves deposition of a metal that forms an intermetallic compound with silicon, but does not react with silicon oxides or silicon nitrides under normal processing conditions. Refractory metals commonly employed in salicide processing include titanium, nickel, and cobalt, each of which form very low resistivity phases with silicon, e.g., $TiSi_2$, $NiSi_2$, and $CoSi_2$. In practice, the refractory metal is deposited in a uniform thickness over all exposed upper surface features of the silicon wafer, preferably by means of physical vapor deposition (PVD) from an ultra-pure sputtering target and an ultra-high vacuum, multi-chamber DC magnetron sputtering system. In MOS transistor formation, deposition is generally performed both after gate etch and after source/drain junction formation. After deposition, the refractory metal blankets the polysilicon gate electrode, the silicon oxide or nitride spacers, the silicon oxide isolation regions, and the exposed portions of the source and drain regions. As a result of a rapid thermal annealing (RTA) process performed in an inert atmosphere, the refractory metal reacts with underlying silicon to forn electrically conductive silicide layer portions on the top surface of the gate electrode and on the exposed portions of the source and drain regions. Unreacted portions of the refractory metal layer, e.g., on the silicon oxide or silicon nitride sidewall spacers and the silicon oxide isolation regions, are then removed, e.g., by use of a wet etch process which is selective to the metal silicide portions. In some instances, e.g., with cobalt, a first RTA step may be performed at a relatively low temperature from about 400° C. to about 550° C. for from about 20 sec to about 120 sec in order to form first-phase CoSi which is then subjected to a second RTA step performed at a relatively high temperature from about 700° C. to about 850° C. for from about 20 sec to about 60 sec to convert the CoSi to second-phase, lower resistivity $CoSi_2$. The second RTA step is performed after selective etch of the non-reacted cobalt. While titanium (Ti) is presently the most prevalent metal utilized in the IC industry for salicide processing, it has a drawback in that titanium silicide ($TiSi_2$) sheet resistance rises dramatically due to narrow-line effects. As a consequence, the use of cobalt silicide ($CoSi_2$) has increased as a result of its replacement of titanium silicide in salicide processing. Second-phase cobalt silicide (CoSi2) advantageously does not display narrow-line effects because it forms by a diffusion reaction mechanism rather than by the nucleation-and-growth mechanism observed with titanium silicide. See, for example, European Patent 0651076.

With either metal or reaction mechanism, silicon underlying the refractory metal layer is consumed by the silicide-forming reaction. Such silicon consumption becomes increasingly problematic as junction depth becomes shallower in order to increase switching speed. Large silicon consumption results in insufficient distance between the bottom of the metal silicide layer and the bottom of the source or drain junction, resulting in junction leakage. The amount of silicon consumption for silicidization depends upon the particular refractory metal silicide formed and is reflected by the "consumption ratio", defined as the ratio of silicon thickness consumed to the metal silicide thickness formed. Thus a low consumption ratio is desirable to minimize silicon consumption. Consumption ratios for titanium, cobalt, and nickel (the most commonly employed metals for forming metal silicides in the IC industry) are 0.9, 1.03, and 0.78, respectively, whereby nickel is clearly the metal of choice based upon this criterion. (See, for example, S. P. Murarka: "Silicides for VLSI Application.) However, it has other limitations which result in cobalt currently being the preferred metal, despite its relatively high consumption ratio for silicide formation.

Referring now to FIGS. 1(A)–1(C), shown therein are steps in a typical self-aligned metal silicide process (salicide process), illustratively cobalt silicide, for manufacturing MOS transistors and CMOS devices according to the conventional art. The term "semiconductor substrate", as used throughout the present disclosure and claims, denotes a silicon-containing semiconductor wafer, e.g., a monocrystalline Si wafer, or an epitaxial silicon-containing layer formed on a semiconductor substrate and comprising at least one region 1 of a first conductivity type. It will be appreciated that for P-MOS type transistors, the region 1 is n-type and for N-MOS type transistors, region 1 is p-type. It will be further appreciated that the substrate may comprise pluralities of n- and p-type regions arrayed in a desired pattern.

As illustrated in FIG. 1(A), reference numeral 1 indicates a portion of a silicon-containing semiconductor substrate of a first conductivity type (p or n), fabricated as a MOS transistor precursor 2 for use in a salicide process scheme. Precursor 2 is processed, as by conventional techniques not described here in detail in order to not unnecessarily obscure the primary significance of the following description. Precursor 2 comprises a plurality of, illustratively two, isolation regions 3 and 3' of a silicon oxide extending from the substrate surface 4 to a prescribed depth below the surface. A patterned gate oxide layer 5, typically comprising a silicon oxide layer about 25 Å thick, is formed at preselected locations along the substrate surface 4. Gate electrode 6, typically of polysilicon, is formed over gate oxide layer 5, with spacers 7, 7', typically of a silicon nitride, formed on the side edges thereof. Source and drain regions 8, 9 of a second conductivity type, opposite that of the substrate 1, are formed, as by ion implantation (using gate electrode 6 and spacers 7, 7' as masks) and high temperature annealing to comprise very shallow and lightly doped first regions ("LDDs") 8' and 9' beneath the spacers 7, 7' and deeper, more heavily doped second regions 8" and 9" extending to the proximal edges of respective isolation regions 3, 3'.

Referring now to FIG. 1(B), a layer 10 of a refractory metal, typically cobalt, nickel or titanium, is formed, as by DC sputtering, to cover the exposed upper surfaces of the precursor 2. Suitable thicknesses of layer 10 are chosen according to the particular metal (due to the above-mentioned differences in silicon consumption ratios) and the junction depth of the second source and drain regions 8" and 9". Typical thicknesses of layer 10 range from about 70 Å to about 200 Å for junction depths from about 800 Å to about 3000 Å. Following refractory metal layer 10 deposition, a thermal treatment, typically rapid thermal annealing (RTA), is performed at a temperature and for a time sufficient to convert metal layer 10 to the corresponding electrically conductive metal silicide, e.g., $CoSi_2$, $NiSi_2$, or $TiSi_2$. Typical RTA conditions for forming $CoSi_2$ in a two-phase process may be as previously described. Since the refractory metal silicide forms only where metal layer 10 is in contact with underlying silicon, the unreacted portions of metal layer 10 formed over the silicon oxide isolation regions 3, 3' and silicon nitride sidewall spacers 7, 7' are selectively removed, as by a wet etch process.

Referring now to FIG. 1(C), the resulting structure after reaction and removal of unreacted metal comprises metal silicide layer portions 11 and 12, 12' respectively formed over gate electrode 6 and source and drain second, heavily doped regions 8" and 9". As is evident from the figure, the lower surfaces of the metal silicide layer portions are rough at the silicide-silicon interfaces, resulting in penetration of the underlying silicon substrate by the silicide. Such penetration of the silicon in the region below the source and drain second regions 8" and 9", illustratively shown at 13, can cause local shorting of the junction, thereby resulting in junction leakage. The effect of penetration is greatest with metals such as cobalt, which have relatively high silicon consumption ratios. Junction penetration can be avoided or at least minimized and junction integrity provided by increasing the junction depth of the source and drain second regions 8", 9" or by providing a thinner refractory metal layer, thereby reducing silicon consumption. However, neither of these alternatives is satisfactory: the former approach runs counter to the trend toward smaller device dimensions, both vertically and laterally, in order to increase switching speeds, and the latter approach results in an increase in metal silicide sheet resistance attendant its decrease in thickness.

A number of techniques for reducing leakage in ultra-shallow junctions employed in MOSFET type semiconductor devices have been proposed, such as are disclosed in U.S. Pat. Nos. 4,835,112; 5,208,472; 5,536,684; and 5,691,212. Such techniques, however, materially add to process complexity and include such steps as germanium implantation to retard dopant diffusion, provision of multiple dielectrics at the edges of the gate electrode, formation of a cobalt silicide-titanium nitride bilayer followed by removal of the titanium nitride layer and ion implantation of the remaining cobalt silicide layer, and formation of an amorphous silicon layer on a silicon MOS precursor and subsequent implantation, oxidation, annealing, etc. steps.

Thus, there exists a need for a simplified methodology for forming self-aligned silicide (i.e., salicide) contacts to ultra-thin transistor source and drain regions which provide low contact sheet resistance, ultra-thin conformal junctions, absence of or at least minimal junction leakage, and easy compatibility with conventional process flow for the manufacture of CMOS devices employing MOS transistors and other junction-containing semiconductor elements. There also exists a need for a process which allows for vertical self-alignment of salicide as well as underlying source/drain junctions, wherein salicide optimization for low sheet resistance is de-coupled from concerns with respect to the integrity of the underlying ultra-shallow junctions, whereby an additional degree of freedom of advanced CMOS device engineering is afforded.

DISCLOSURE OF THE INVENTION

An advantage of the present invention is a method of manufacturing a high density integrated semiconductor device with an improved self-aligned contact structure.

Another advantage of the present invention is a method of forming CMOS and similar type devices and transistors with metal silicide-contacted, ultra-shallow source and drain regions having conformal junction layers exhibiting very low junction leakage.

Still another advantage of the present invention is a method of forming a low sheet resistance, self-contacted ultra-shallow junction in a silicon containing substrate.

Yet another advantage of the present invention is a MOS transistor having very low sheet resistance self-aligned salicide contacts and ultra-shallow, conformal source and drain junction regions with very low junction leakage.

Additional advantages, and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, which method comprises:

forming a refractory metal layer on a surface of a first conductivity type region of a silicon-containing semiconductor substrate, this metal layer being capped or uncapped;

heating to convert the metal layer to an electrically conductive metal silicide layer, the metal silicide layer having an irregularly contoured lower surface in contact with underlying silicon of the substrate region;

forming a layer of a dielectric material over the metal silicide layer;

implanting dopant impurities of second, opposite conductivity type into the dielectric layer; and heating to out-diffuse the implanted dopant impurities from the dielectric layer through the underlying metal silicide layer into the silicon substrate region to form a thin, substantially constant thickness, heavily doped layer of second conductivity type beneath and in conformal contact with the metal silicide layer, the thin doped layer of second conductivity type forming an ultra-shallow depth junction with the first conductivity type region of the substrate and the metal silicide layer forming a self-aligned, low sheet resistance ohmic contact to the thin doped layer.

In embodiments according to the invention, the semiconductor device comprises a self-aligned MOS transistor and the silicon-containing semiconductor substrate comprises a MOS transistor precursor comprising:

a pair of spaced apart isolation regions extending from the substrate surface to a depth below the surface;

a pair of spaced apart, shallow depth, lightly doped source and drain regions of a second, opposite conductivity type formed in the substrate surface between the isolation regions and each extending to a proximal edge of a respective isolation region;

a patterned, thin gate insulating layer formed on the substrate surface between and extending to respective proximal edges of the source and drain regions;

a gate electrode in overlying contact with the gate insulating layer, the gate electrode comprising opposing side surfaces and a top surface; and insulative sidewall spacers formed on the side surfaces of the gate electrode and covering underlying portions of the lightly doped, shallow depth source and drain regions;

said method comprising:

forming the metal layer on exposed surfaces of the isolation regions, the source and drain regions, the top surface of the gate electrode, and the sidewall spacers of the MOS transistor precursor;

heating to selectively convert portions of the metal layer in contact with underlying silicon to electrically conductive metal silicide layer portions, the portions of the lightly doped, shallow depth source and drain regions below the metal layer being consumed during the conversion into metal silicide layer portions;

forming the layer of dielectric material over at least the metal silicide layer portions overlying the consumed portions of the source and drain regions;

implanting dopant impurities of the second, opposite conductivity type into at least the portions of the dielectric layer overlying the metal silicide layer portions overlying the consumed portions of the source and drain regions; and heating to out-diffuse the implanted dopant ions from the dielectric layer portions through the underlying metal silicide layer portions to form thin, heavily doped, second conductivity type layers in the silicon-containing substrate beneath and in conformal contact with the overlying metal silicide layer portions, the thin, heavily doped second conductivity type layers (a) forming ultra-shallow depth, heavily doped source and drain regions in the first conductivity type silicon-containing substrate; (b) extending into touching contact with the shallow depth, lightly doped source and drain regions underlying the sidewall spacers; (c) being self-aligned to the metal silicide-silicon interface; (d) having a substantially constant thickness; and (e) conforming to variations in the irregular lower surface contour of the overlying metal silicide layer portions.

In embodiments according to the invention, the isolation regions each comprise a silicon oxide; the thin gate insulating layer comprises a silicon oxide; the gate electrode comprises polysilicon; the sidewall spacers each comprise a silicon nitride or silicon oxynitride; the metal layer comprises a cobalt metal layer, the metal silicide layer comprises a cobalt silicide layer, the dielectric layer comprises a silicon oxide layer, the dopant impurities comprise boron containing ions or phosphorus or arsenic containing ions; and the ions are implanted under conditions selected such that they are implanted only into the dielectric layer and no metal from the metal silicide layer is secondarily implanted into the underlying silicon of the substrate.

Additional advantages of the present invention will become readily apparent to those skilled in the art from the following detailed description, wherein only the preferred embodiment of the present invention is shown and described, simply by way of illustration of the best mode contemplated for carrying out the method of the present invention. As will be described, the present invention is capable of other and different embodiments, and its several details are capable of modification in various obvious respects, all without departing from the present invention. Accordingly, the drawing and description are to be regarded as illustrative in nature, and not as limitative.

DESCRIPTION OF THE INVENTION

Figure 1A:
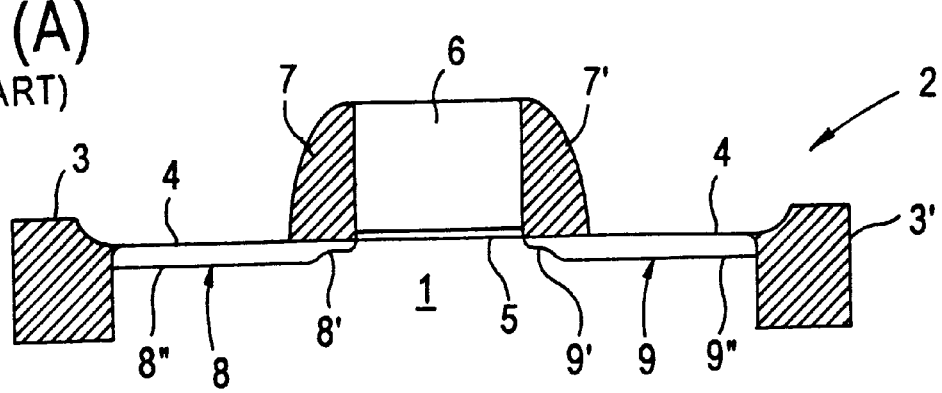
FIGS. 1(A)–1(C) are simplified, cross-sectional schematic diagrams illustrating process steps for forming salicide contacts to the source and drain region of a MOS transistor, according to conventional processing technology.
Figure 1B:
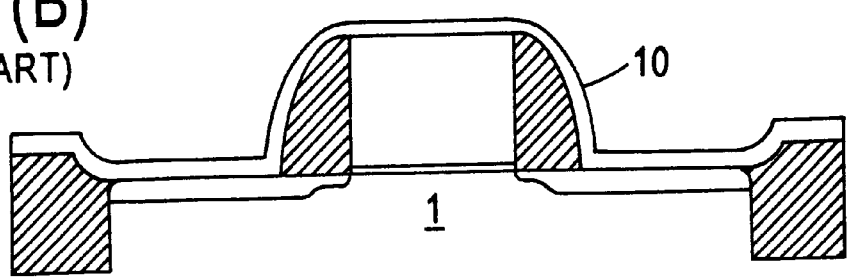
Figure 1C:
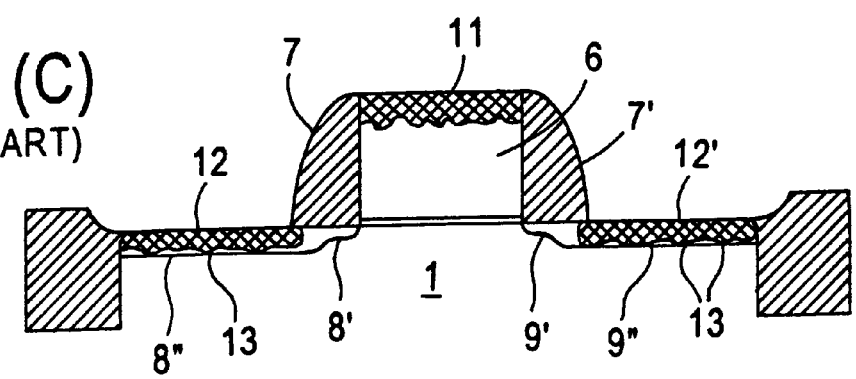
Figure 2A:
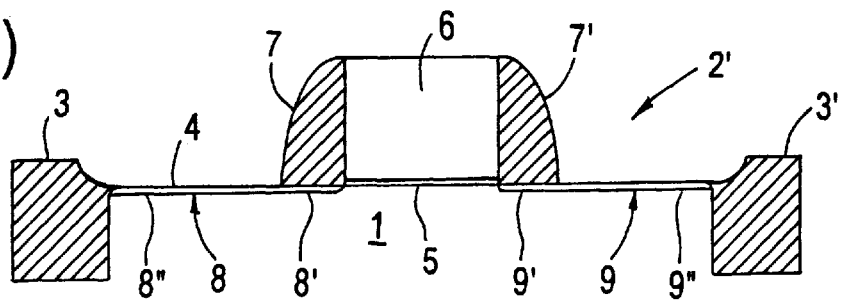
FIGS. 2(A)–2(E) are simplified, cross sectional schematic diagrams illustrating process steps for forming salicide contacts to the source and drain regions of a MOS transistor, in accordance with an embodiment of the present invention.
Figure 2B:
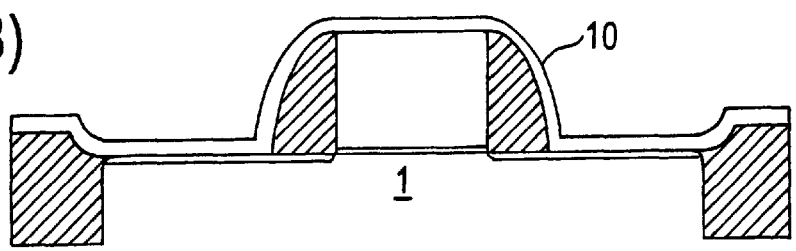
Figure 2C:
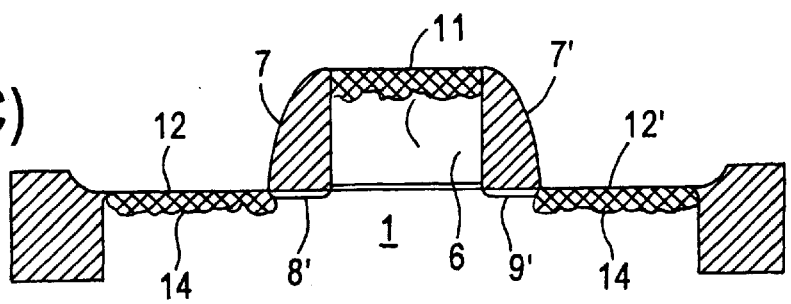
Figure 2C:

Referring to FIGS. 2(A)–2(E), wherein like reference numerals are used to designate the same features illustrated in FIGS. 1(A)–1(C), shown in FIG. 2(A) is a CMOS device precursor 2' similar to that illustrated in FIG. 1(A), and prepared in a similar fashion by means of conventional techniques not described here in detail in order to not unnecessarily obscure the present invention. Precursor 2' differs from that shown in FIG. 1(A) in that source and drain regions 8 and 9 formed therein or thereon comprise lightly doped (i.e. about $9\times10^{19}$ da/cm$^3$), shallow layers of conductivity type opposite that of semiconductor substrate region 1, the layers extending at a uniform thickness in the range from about 100 Å to about 1000 Å between opposing edges of thin gate oxide layer 5 to the proximal edges of the respective isolation regions 3 and 3'. As before, it is understood that for P-MOS transistors, region I is of n-type conductivity and for N-MOS transistors, region 1 is of p-type conductivity. Moreover, CMOS devices will, of course, comprise both n- and p-type regions 1 formed in the substrate in spaced apart array. Referring now to FIG. 2(B), a layer 10 of a refractory metal, typically cobalt, nickel or titanium, preferably cobalt, is formed to cover the exposed upper surfaces of precursor 2', in a fashion completely analogous to that of the conventional art shown and described with respect to FIG. 1(B). As before, layer 10 is then subjected to a rapid thermal annealing process (RTA) to convert portions thereof in contact with underlying silicon to an electrically conductive metal silicide. In the case of a cobalt layer 10, RTA is preferably performed according to a two-phase process as described above FIG. 2(C) shows the result after RTA and removal of unreacted portions of the refractory metal layer 10. As is evident from the figure, the portions 8", 9" (sometimes referred to as "extensions") of the lightly doped, shallow source/drain regions 9 in underlying contact with the refractory metal layer 10 are consumed during the silicidization reaction effected by the RTA process, leaving lightly doped source/drain (LDD) regions 8' and 9' beneath respective sidewall spacers 7 and 7'. Metal silicide portions 11 and 12, 12', respectively formed over the top surface of gate electrode 6 and source/drain regions 8, 9, attain a thickness dependent upon the initial metal layer 10 thickness and the aforementioned silicon consumption ratio of the chosen refractory metal. For example, with a cobalt layer 10 of thickness from about 70 Å to about 2000 Å, $CoSi_2$ layers of thickness from about 250 Å to about 730 Å and sheet resistance from about 10 ohms/square to about 3 ohms/square are formed as a result of two-phase silicidization reaction performed as described above. As is also evident from the figure, the lower surfaces 14 of the metal silicide layer portions 11 and 12, 12' are irregular at their respective interfaces with underlying silicon of substrate 1.

Figure 2D:
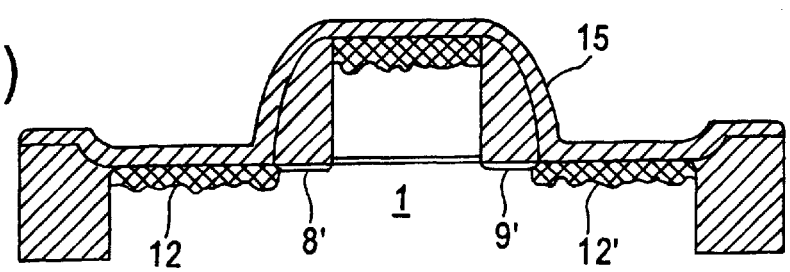

Referring now to FIG. 2(D), a layer 15 of a dielectric material, e.g., a silicon oxide, silicon nitride, or silicon oxynitride, is formed over at least metal silicide layer portions 12, 12', as by conventional techniques not described here for illustrative simplicity, and then subjected to a source/drain implantation process performed under conditions such that no metal (e.g., cobalt) from the metal silicide (e.g., $CoSi_2$) layer portions is secondarily implanted into the underlying silicon of substrate 1 by momentum transfer ("knock-on"). Prevention of such secondary implantation is necessary to avoid metal-induced junction leakage. In a typical process for forming PMOS transistors and employing a silicon oxide dielectric layer 15 of thickness from about 250 Å to about 2500 Å, boron-containing p-type dopant ions 16 are implanted at a dosage from about $1 \times 10^{15}$ $da/cm^2$ to about $1 \times 10^{16}$ $da/cm^2$ at an implantation energy from about 10 keV to about 100 keV. In a similar process for forming NMOS transistors and employing a silicon oxide dielectric layer 15 of similar thickness, phosphorus- or arsenic- containing n-type dopant ions 16 are implanted at a dosage from about $1 \times 10^{15}$ $da/cm^2$ to about $1 \times 10^{16}$ $da/cm^2$ at an implantation energy from about 10 keV to about 100 keV.

Figure 2E:
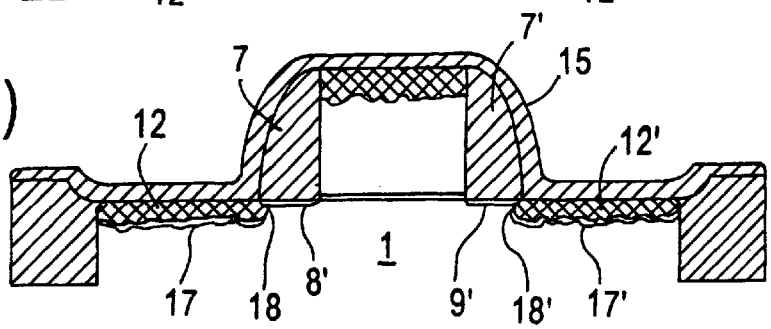

Referring now to FIG. 2(E), the ion-implanted dielectric layer 15 is then subjected to a low temperature annealing for out-diffusion of the implanted dopant to form ultra-shallow source/drain junction regions 17, 17' of average depth below the respective metal silicide layer portion 12, 12' from about 50 Å to about 500 Å and in touching contact (at 18, 18') with lightly doped source/drain regions (LDDs) 8', 9'. Such junction regions self-aligned to and in conformal contact with the metal silicide/silicon interface avoid junction leakage regardless of the metal silicide layer 12, 12' thickness and interface shape, roughness, or contour. For example, for ion-implanted cobalt silicide layer portions 12, 12' of thickness from about 250 Å to about 730 Å, low temperature thermal treatment for out-diffusion of the implanted ions comprises heating at a temperature from about 750° C. to about 900° C. for from about 60 sec to about 600 sec. Because of the high diffusivities of dopants in $CoSi_2$ and the high segregation coefficients of the dopants between metal silicides and silicon, heavily-doped junction regions 17, 17' of dopant concentration from about $8 \times 10^{19}$ $da/cm^3$ to about $4 \times 10^{20}$ $da/cm^3$ form very close to, e.g., within about 50 Å to about 500 Å, preferably about 300 Å, of the $CoSi_2$/Si interface, following any given interface roughness or contour.

As a consequence of the methodology of the present invention, junction integrity can be maintained even for very shallow, heavily-doped junctions such as herein contemplated, avoiding the risk of high level junction leakage by silicide-induced local short circuits as in the conventional art. Moreover, due to the vertical self-alignment of the metal silicide and the source/drain junction regions, silicide optimization for low sheet resistance and junction integrity can be de-coupled, advantageously introducing an additional degree of freedom in CMOS device engineering.

Following source/drain junction region 17, 17' formation by out-diffusion of dopant from dielectric layer 15, the latter is removed either partially or completely, and the resultant subjected to further device processing as is conventional in the art, e.g., contact formation to the source, gate, and drain regions, followed by dielectric overlayer deposition.

Thus, the present invention provides several technological advantages over existing methodology, including, but not limited to, formation of self-aligned, ultra-shallow, heavily-doped source and drain junction regions, which junction regions avoid junction leakage normally associated with formation of overlying low sheet resistance metal silicide contacts thereto. The inventive method is easily compatible with conventional process methodology and permits an additional degree of freedom in fabricating low sheet resistance salicide contacts to ultra-shallow source/drain regions.

In the previous descriptions, numerous specific details are set forth, such as particular materials, structures, reactants, processes, etc. in order to provide a thorough understanding of the present invention. However, it should be recognized that the present invention can be practiced without resorting to the details specifically set forth. In other instances, well-known processing structures and techniques have not been described in detail in order not to unnecessarily obscure the present invention.

Only the preferred embodiments of the present invention are shown and described herein. It is to be understood that the invention is capable of changes or modifications within the scope of the inventive concept as expressed herein.

What is claimed is:

1. A method of manufacturing a semiconductor device, which method comprises the steps of:

forming a metal layer on a surface of a first conductivity type region of a silicon-containing semiconductor substrate;

heating to convert said metal layer to an electrically conductive metal silicide layer, said metal silicide layer penetrating into and having a lower surface in contact with underlying silicon of said silicon-containing substrate region;

forming a layer of a dielectric material over said metal silicide layer;

ion-implanting dopant impurities of second, opposite conductivity type into said dielectric layer; and heating to out-diffuse the implant dopant impurities from the dielectric layer through the underlying metal silicide layer into the silicon-containing substrate region to form a substantially constant thickness, heavily doped layer of second conductivity type beneath and in conformal contact with said metal silicide-layer, said heavily doped layer of second conductivity type forming an ultra-shallow depth junction with said first conductivity type region of said silicon-containing substrate and said metal silicide layer forming a self-aligned, low sheet resistance ohmic contact to said heavily doped layer.

2. The method as in claim 1, wherein said metal layer comprises a metal chosen from the group consisting of cobalt, nickel, and titanium.

3. The method as in claim 2, wherein the metal layer comprises a cobalt layer of thickness from about 70 Å to about 200 Å.

4. The method as in claim 3, wherein said metal silicide layer comprises a cobalt silicide layer of thickness from about 250 Å to about 730 Å and having a sheet resistance from about 7 ohms/square to about 3 ohms/square.

5. The method as in claim 4, wherein said heating for forming said cobalt silicide comprises a first-phase heating at a temperature from about 400° C. to about 550° C. for from about 20 sec to about 120 sec and a second-phase heating at a temperature from about 700° C. to about 850° C. for from about 20 sec to about 60 sec, each heating phase being performed in an inert atmosphere.

6. The method as in claim 1, wherein said dielectric layer comprises a material selected from the group consisting of silicon oxide, silicon nitrides, and silicon oxynitrides.

7. The method as in claim 6, wherein said dielectric layer comprises a silicon oxide layer of thickness from about 250 Å to about 2500 Å.

8. The method as in claim 1, wherein the conditions for ion implantation are selected such that dopant impurities are implanted only into said dielectric layer and no metal from said metal silicide layer is secondarily implanted into the underlying silicon of said silicon-containing substrate.

9. The method as in claim 8, wherein said silicon-containing substrate region is of n-type conductivity and said dopant impurities comprise p-type dopant ions.

10. The method as in claim 9, wherein said p-type dopant ions comprise boron containing ions implanted at a dosage from about $1 \times 10^{15}$ da/cm$^2$ to about $1 \times 10^{16}$ da/cm$^2$ at an implantation energy from about 10 keV to about 100 keV.

11. The method as in claim 8, wherein said silicon-containing substrate region is of p-type conductivity and said dopant impurities comprise n-type dopant ions.

12. The method as in claim 11, wherein said n-type dopant ions comprise phosphorus or arsenic containing ions implanted at a dosage from about $1 \times 10^{15}$ da/cm$^2$ to about $1 \times 10^{16}$ da/cm$^2$ at an implantation energy from about 10 keV to about 100 keV.

13. The method as in claim 1, comprising heating for out-diffusion of the implanted dopant ions from the dielectric layer at a temperature from about 750° C. to about 950° C. for from about 60 sec to about 600 sec.

14. The method as in claim 13, comprising forming an ultra-shallow depth, heavily doped junction-forming layer exceeding the CoSi$_2$/Si interface from about 50 Å to about 500 Å and with a dopant concentration from about $8 \times 10^{19}$ da/cm$^3$ to about $2 \times 10^{20}$ da/cm$^3$.

15. The method as in claim 14, wherein the silicon-containing substrate is in conformal contact with the heavily doped source and drain regions.

16. The method as in claim 1, wherein said heavily doped layer of second conductivity type is in conformal contact with the first conductivity type region of the silicon-containing semiconductor substrate.

17. The method as in claim 1, wherein said semiconductor device comprises a self-aligned MOS transistor and said silicon-containing silicon-containing semiconductor substrate comprises a MOS transistor precursor comprising:

a pair of spaced apart isolation regions extending from said substrate surface to a depth below said surface;

a pair of spaced apart, shallow depth, lightly doped source and drain regions of a second, opposite conductivity type formed in said silicon-containing substrate surface between said isolation regions and each extending to a proximal edge of a respective isolation region;

a patterned, thin gate insulating layer formed on said silicon-containing substrate surface between and extending to respective proximal edges of said lightly doped source and drain regions;

a gate electrode in overlying contact with said gate insulation layer, said gate electrode comprising opposing side surfaces and a top surface; and insulating sidewall spacers formed on said side surface of said gate electrode and covering underlying portions of said lightly doped, shallow depth source and drain regions; said method comprising:

forming said metal layer on exposed surfaces of said isolation regions, said lightly doped source and drain regions, said top surface of said gate electrode, and said sidewall spacers of said precursor;

heating to selectively convert portions of said metal layer in contact with underlying silicon to electrically conductive metal silicide layer portions, the portions of said lightly doped, shallow depth source and drain regions below said metal layer being consumed during the conversion into metal silicide layer portions;

forming said layer of dielectric material over at least the metal silicide layer portions overlying said consumed portions of said lightly doped source and drain regions;

ion-implanting dopant impurities of said second, opposite conductivity type into at least the portions of said dielectric layer overlying the metal silicide layer portions overlying said consumed portions of said lightly doped source and drain regions; and heating to out-diffuse the implanted dopant impurities from the dielectric layer portions through the underlying metal silicide layer portions to form heavily doped, second conductivity type layers in said silicon-containing substrate beneath and in conformal contact with the overlying metal silicide layer portions, said heavily doped second conductivity type layers (a) forming ultra-shallow depth, heavily doped source and drain regions in said first conductivity type silicon-containing substrate; (b) extending into touching contact with unconsumed portions of the shallow depth, lightly doped source and drain regions underlying said sidewall spacers; (c) being self-aligned to the metal silicide-silicon interface; (d) having substantially constant thickness; and (e) conforming to variations in the irregular lower surface contour of the overlying metal silicide layer portions.

18. The method as in claim 17, further comprising selectively removing non-silicided portions of the metal layer.

19. The method as in claim 17, wherein:

said isolation regions each comprises a silicon oxide;

said thin gate insulation layer comprises a silicon oxide;

said gate electrode comprises polysilicon; and said sidewall spacers each comprise a silicon nitride or silicon oxynitride.

* * * * *